(12) United States Patent
Kim et al.

(10) Patent No.: US 6,506,616 B1
(45) Date of Patent: Jan. 14, 2003

(54) PHOTOLITHOGRAPHIC METHOD FOR FABRICATING ORGANIC LIGHT-EMITTING DIODES

(75) Inventors: Tae S. Kim, Dallas, TX (US); Francis G. Celii, Dallas, TX (US); Simon J. Jacobs, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/714,472

(22) Filed: Nov. 16, 2000

Related U.S. Application Data

(60) Provisional application No. 60/166,530, filed on Nov. 18, 1999.

(51) Int. Cl.[7] .................................................. H01L 21/00
(52) U.S. Cl. ........................................... 438/22; 438/99
(58) Field of Search ............................ 438/22, 25, 26, 438/99, 725; 257/100, 40

(56) References Cited

U.S. PATENT DOCUMENTS

| | | | | |
|---|---|---|---|---|
| 4,507,672 A | * | 3/1985 | Potember et al. | 428/99 |
| 5,399,502 A | * | 3/1995 | Friend et al. | 438/22 |
| 5,739,545 A | * | 4/1998 | Guha et al. | 257/40 |
| 6,013,538 A | * | 1/2000 | Burrows et al. | 438/22 |
| 6,127,693 A | * | 10/2000 | Chen et al. | 257/40 |
| 6,228,562 B1 | * | 5/2001 | Kawanishi | 430/321 |
| 6,274,979 B1 | * | 8/2001 | Celii et al. | 313/506 |

\* cited by examiner

*Primary Examiner*—Richard Booth
*Assistant Examiner*—Christopher Lattin
(74) *Attorney, Agent, or Firm*—Frederick J. Telecky, Jr.; W. James Brady, III

(57) ABSTRACT

A method of photolithographically patterning an organic semiconductor device, comprising the steps of protecting the organic layer of the device by depositing a metal layer thereon, depositing and patterning a photoresist layer on said metal layer, and selectively etching the exposed areas to pattern said metal layer and said organic layer. Specifically, the disclosed method provides the photolithographic fabrication of organic light emitting diodes (OLEDs) and organic lasers diodes (OLDs).

11 Claims, 7 Drawing Sheets

PHOTOLITHOGRAPHIC METHOD FOR FABRICATING ORGANIC LIGHT-EMITTING DIODES

This application claims the benefit of provisional application No. 60/166,530, filed Nov. 18, 1999.

FIELD OF THE INVENTION

The present invention is related in general to the field of semiconductor devices and processes and more specifically to the method for fabricating photolithographically defined encapsulated organic light-emitting diodes.

DESCRIPTION OF THE RELATED ART

Commercial light emitting diodes (LEDs) typically constitute a p-n junction of inorganic, doped semiconducting materials such as gallium arsenide (GaAs) or aluminum gallium arsenide (AlGaAs). At these junctions between the doped layers, recombination of electrons and holes results in interband emission of light.

In contrast, organic materials are difficult to dope. P-N junctions are not stable and light emitting diodes are therefore designed on p-i-n structures, where the emissive layer in which the charge recombination occurs is nominally intrinsic. Due to the softness of the organic lattice, carriers tend to be polaronic in nature and recombine to form relatively localized molecular excited states (excitons), which then lead to luminescence by the organic material, providing organic light-emitting diodes (OLEDs).

Recently, OLEDs have drawn much attention, especially for emissive display applications. Since OLEDs can be fabricated on any smooth surface, such as silicon wafers, and at low (<100° C.) temperatures, they are also very promising for many optoelectronic applications. Electroluminescent devices have been constructed using multi-layer organic films. Basic structure and working are described in "Electroluminescence of Doped Organic Thin Films" (J. Appl. Phys., vol. 65, pp. 3610–3616, 1989) by C. W. Tang, S. A. VanSlyke, and C. H. Chen. The review article "Status of and Prospects for Organic Electroluminescence" (J. Materials Res., vol. 11, pp. 3174–3187. December 1996, by L. J. Rothberg and A. J. Lovinger) describes various OLED device structures in the form of stacks of thin layers with carrier injection and transverse current flow. For example, the stack may be a transparent substrate (for instance, glass), a transparent anode (for instance, indium-tin oxide, ITO) , a hole transport layer (for instance, TPD), an emissive layer which also is an electron transport layer and in which electron-hole recombination and luminescence occur (for instance, Alq3), and a cathode (a metal with low work function, for instance, magnesium or a magnesium-containing alloy such as Mg:Ag). "TPD" is N,N'-diphenyl-N,N'-bis(3-methylphenyl)1,1'biphenyl-4,4'diamine. "Alq3" is tris(8-hydroxy) quinoline aluminum.

The schematic energy level diagram exhibits discontinuities between the emitter and the hole transport layer. The discontinuity is greater for electron transport to the hole transport layer than the discontinuity in the opposite direction; consequently, holes from the hole transport layer inject into the emitter and recombine with electrons to form excitons, which in turn excite the emitter to luminesce.

A different approach using siloxane self-assembly techniques, has been described in U.S. Pat. No. 5,834,100, issued on Nov. 10, 1998 (Marks et al., "Organic Light-Emitting Diodes and Method for Assembly and Emission Control").

In addition to the OLEDs, many related devices such as organic laser diodes, photodetectors, etc. may be realized using organic semiconductors. For many applications such as on-chip interconnects, laser diodes are preferred over LEDs. Laser action has been demonstrated in polymeric organic films, but only by employing optical pumping (for instance, "Laser Emission from Solutions and Films Containing Semiconducting Polymer and Titanium Dioxide Nanocystals", Chem. Phys. Lett., vol. 256, pp. 424–430, 1996, by F. Hide, B. J. Schwartz, M. A. Diaz-Garcia, and A. J. Heeger; "Lasing from Conjugated-Polymer Microcavities", Nature, vol. 382, pp. 695–697, by N. Tessler, G. J. Denton, and R. H. Friend; "Semiconducting Polymers: a New Class of Solid-State Laser Materials", Science, vol. 273, pp. 1833–1836, 1996, by F. Hide, M. A. Diaz-Garcia, B. J. Schwartz, M. R. Andersson, Q. Pei, and A. J. Heeger). Inadequate charge injection is the main roadblock in achieving an organic-based solid-state laser from electrically pumped organic films.

In their paper "Enhanced Electron Injection in Organic Electroluminescence Devices using an Al/LiF Electrode" (Appl. Phys. Lett., vol. 70, pp.152–154, 1997), L. S. Hung, C. W. Tang, and M. G. Mason disclose the beneficial effects of inserting an inorganic dielectric layer (LiF, thin enough for electron tunneling, 0.5 to 1.0 nm) between the metal cathode (Al) and organic material.

The energy bands of Alq3 are bent downwards by the contact with LiF, thus substantially lowering the electronic barrier height of the Alq3-Al interfaces and enhancing the electron injection. The operating voltage is reduced and cathode metals of higher work function can be used. Further, the devices employ a thin (15 nm) buffer layer at the anode (ITO), comprised of CuPc (copper phthalocyanine). The hole transport layer is NPB (N,N'-bis(1-naphthyl)-N, N'diphenyl-1,1'-biphenyl-4,4'-diamine). Alq3 is the emissive as well as electron transport layer.

Methods for fabrication and characterization (such as film thickness, and light intensity and wavelength) have been described in "Characterization of Organic Thin Films for OLEDs using Spectroscopic Ellipsometry" (F. G. Celii, T. B. Harton, and O. F. Phillips, J. Electronic Materials, vol. 26, pp. 366–371, 1997). The organic materials may be amorphous or polycrystalline discrete molecular, or may be polymeric. Polymer layers differ from discrete molecular layers because they are typically not fabricated by vacuum vapor deposition, but rather by spin coating from an appropriate solvent. The polymeric layers may also be deposited (either by vapor deposition or by spin coating) as pre-polymer layers and then converted either thermally or photochemically to the active form. Spin coating, spin casting, or melt techniques have the advantage of large area coverage and low fabrication cost.

In U.S. patent application Ser. No. 09/156,166, filed on Sep. 17 1998 (Celii et al., "Organic Light Emitting Diodes"), to which the present invention is related, an OLED is provided with dielectric barriers at both the anode-organic and cathode-organic interfaces. Increased carrier injection efficiencies and increased overall OLED efficiency plus lower voltage operation are thus enabled.

One of the major difficulties in fabricating OLEDs and organic laser diodes (OLDs) is that many solvents used for cleaning or photolithography dissolve the organic layer of the OLEDs and OLDs. As a result, OLEDs are currently fabricated by using shadow masks. Use of shadow masks may be acceptable for certain applications, but the majority of applications, especially those requiring small OLEDs, will require a fabrication process based on photolithography. In addition, since exposure of the organic layer to moisture (or oxygen) may degrade the light-emitting characteristics of the organic material, the organic layer needs to be encapsulated. Although an encapsulation process by reactive ion etching of the organic layer with an aluminum mask layer has been reported in the literature (C. C. Wu, J. C. Sturm, R. A. Register, and M. E. Thompson, "Integrated Three-Color Organic Light-Emitting Devices", Appl. Phys. Lett., vol. 69, pp. 3117–3119, 1996), the mask layer was patterned by a shadow mask, not by a photolithography process.

An urgent need has therefore arisen to conceive structure and fabrication methods of electrically pumped organic laser diodes based on photolithography techniques suitable for miniaturization and high process yield. Preferably, this concept should be based on fundamental design solutions flexible enough to be applied for different diode and laser product families and a wide spectrum of material and assembly variations. Manufacturing should be low cost and the devices stable and reliable. Preferably, the innovations should be accomplished using established fabrication techniques and the installed equipment base.

SUMMARY OF THE INVENTION

According to the present invention, a method of photolithographically patterning an organic semiconductor device is provided, comprising the steps of protecting the organic layer of the device by depositing a metal layer thereon, depositing and patterning a photoresist layer on said metal layer, and selectively etching the exposed areas to pattern said metal layer and said organic layer. Specifically, the disclosed method provides the photolithographic fabrication of organic light emitting diodes (OLEDs) and organic lasers diodes (OLDs).

It is an aspect of the present invention to form the metal/organic interface before the surface of the organic layer is exposed to the ambient or moisture.

Another aspect of the invention is to fabricate OLEDs whose organic layer is encapsulated.

Another aspect of the invention is produce a plurality of OLEDs concurrently.

Another aspect of the invention is to provide OLED fabrication on a transparent substrate or a semiconductor substrate having an integrated circuit.

In the first embodiment of the invention, the photolithographic patterning of the OLEDs is achieved by protecting the organic layer with the cathode metal layer ("top" electrode metal layer). Preferably, the top metal layer is aluminum. The sequence of process steps is as follows:

1—Forming and patterning the anode ("bottom" electrode) layer;
2—Depositing and patterning the insulating layer between the bottom and top electrode;
3—Depositing the organic layer and (immediately thereafter) the top electrode layer;
4—Spin coating and patterning a photoresist layer for defining OLED areas;
5—Removing the top electrode and organic layers in the unmasked areas;
6—Removing the photoresist from the remaining top electrode areas;
7—Depositing the encapsulation layer;
8—Spin coating and patterning a photoresist layer for defining the contact and encapsulation areas;
9—Removing the encapsulation layer in the unmasked areas;
10—Removing the photoresist from the remaining encapsulation layer; and
11—Depositing a protective overcoat layer.

In the second embodiment of the invention, the remaining photoresist is not removed and the encapsulating layer deposited next can make contact to the top electrode layer from the side.

Numerous variations of individual process steps are described. Electrical and optical parameters are employed to demonstrate that no degradation of the OLED characteristics are observed. By way of example, when ion milling is demonstrated as a method for patterning the layers, the need for temperature control is emphasized.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 2: Depositing and patterning a (transparent) bottom electrode layer.

FIG. 3: Depositing and patterning an insulating layer.

FIG. 4: Depositing a light-emitting organic layer and the top electrode layer.

FIG. 5: Spin coating and patterning a photoresist layer.

FIG. 6: Removing the top metal layer and the organic layer from the unmasked areas.

FIG. 7: Removing the remaining photoresist layer.

FIG. 8: Evaporating an encapsulating metal layer.

FIG. 9: Patterning the encapsulation layer and contact area, and removing the remaining photoresist layer.

FIG. 10: Bottom electrode definition.

FIG. 11: Insulating layer definition.

FIG. 12: OLED definition.

FIG. 13: Metal encapsulation and top electrode contact area definition.

FIGS. 14 to 16 describe a lift-off technique.

FIG. 14: Patterning photoresist layer.

FIG. 15: Depositing mask metal layer.

FIG. 16: Lifting off.

FIG. 17 illustrates the encapsulating metal layer making contact to the top electrode layer from the edge sides.

DETAILED DESCRIPTION OF THE PREFERRED EMBODIMENTS

Figure 1:
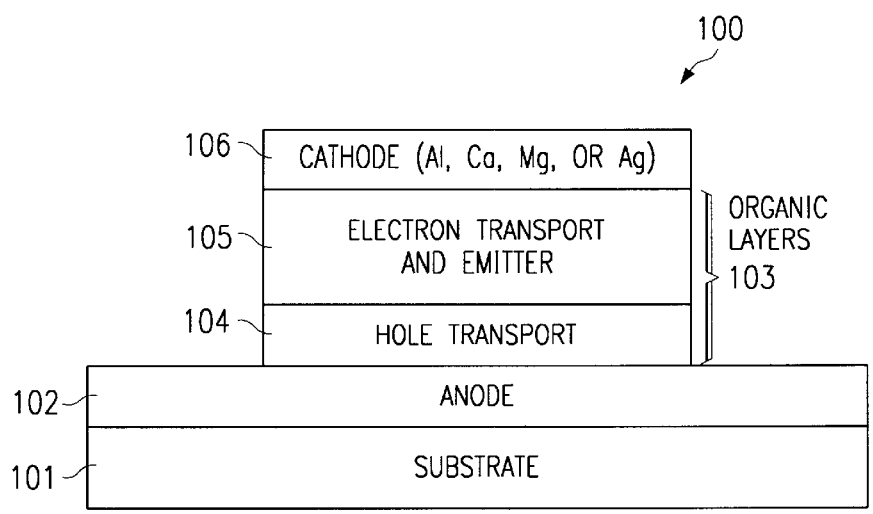
FIG. 1 is a simplified and schematic cross section of an OLED structure as fabricated by the present invention.

In FIG. 1, the OLED, generally designated 100, is constructed upon smooth substrate 101, typically made of silicon or a transparent material such as glass. The OLED consists of a stack of layers, deposited and structured in sequence, preferably at temperatures <100° C. The first layer is anode layer 102, preferably made of transparent ITO (indium-tin oxide) in the thickness range from about 100 to 150 nm. In the simplified case, anode layer 102 is followed by organic layers 103. In FIG. 1, these layers provide a layer 104 for hole transport, made of TPD in the thickness range from about 15 to 30 nm. For some material combinations, layer 104 may be between 40 and 50 nm thick.

Alternatively, hole transport layer 104 is made of PPV (polyparaphenylene-vinylene), between about 20 and 30 nm thick.

Organic layer 104 is followed by organic layer 105, which provides the light emission and the electron transport. Layer 105 is preferably made of undoped Alq3 in the thickness range from about 55 to 80 nm. For some optical applications, emissive Alq3 layer 105 may comprise dopants for achieving the desired light intensity at the preferred wavelength (i.e., for changing the color of the emitted radiation). The dopant may be a dye such as QAC (quinacridone) or DCM (4-(dicyanomethylene)-2-methyl-6-(4-dimethylaminostyryl)-4H-pyran). The dye dopant may be evaporated concurrently with the Alq3 to further increase efficiency; doping concentrations usually <5%. The QAC-doped emissive layer 105 provides green light, the DCM-doped layer yellow light.

Alternatively, emissive layer 105 is made of CN-PPV (cyano-substituted PPV), between about 70 and 80 nm thick.

Organic layer 105 is followed by cathode layer 106, preferably made of aluminum or magnesium-aluminum, about 150 to 250 nm thick. Alternative materials for cathode layer 106 are silver or aluminum-calcium mixtures. Overall, OLED 100 may have an area of about 5 mm$^2$.

In the schematic cross sections of FIGS. 2 to 9, the sequential steps of the process flow according to the invention are illustrated which employ photolithographic techniques to pattern the OLED structures, and further complete the forming of the metal/organic interfaces before the surface of the organic layers are exposed to the ambient or moisture. The organic layers of the OLEDs are encapsulated, and in one embodiment the encapsulation also serves as the cathode electrode.

Figure 2:
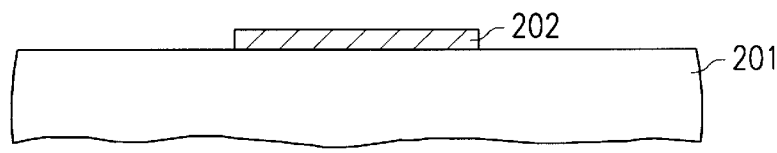
FIGS. 2 to 9 are schematic cross sectional views of the structures created sequentially by OLED fabrication steps according to the invention. The structures shown are created after the following process steps.

FIG. 2 illustrates process STEP #1: Formation and patterning of the anode layer 202. This layer is deposited onto substrate 201 (for instance made of transparent glass). As mentioned above, anode 202 is preferably made of transparent and conducting indium tin oxide (ITO) or zinc oxide, from about 100 to 150 nm thick. Alternatively, it can be made of thin gold in the thickness range from about 4 to 6 nm.

As defined herein, the anode of the OLED is also referred to as the "bottom electrode", without any particular reference to the actual geometric positioning of the OLED or its constituent electrodes. Furthermore, the cathode of the OLED is herein frequently referred to as the "top electrode".

Process STEP #1 requires photomask #1, including standard photo-technology of aligning, exposing, and etching.

Figure 3:
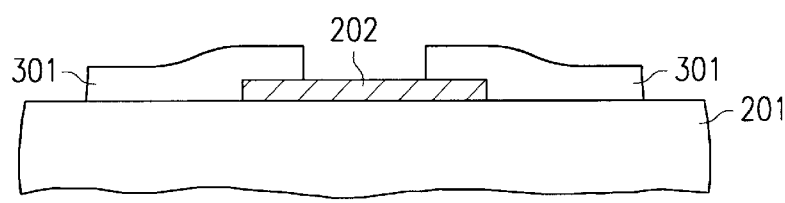

FIG. 3 illustrates process STEP #2 is: Deposition and patterning of the insulating layer 301 between the bottom electrode 202 and the future top electrode. Preferred material is silicon nitride or silicon dioxide in the thickness range from about 30 to 100 nm. If small amounts of permeation is acceptable, even photoresist material may be used. Such insulating layer is needed only if the encapsulating layer (see below) is electrically conducting and consequently could make contact to the bottom electrode as well as to the top electrode.

Process STEP #2 requires photomask #2.

Figure 4:
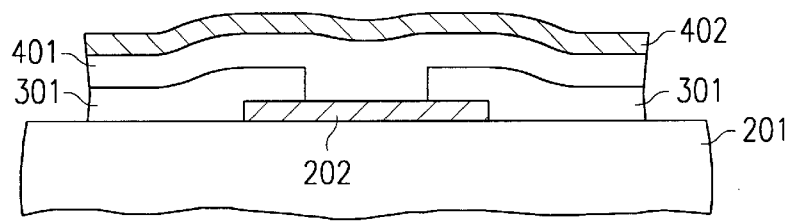

FIG. 4 illustrates process STEP #3: Consecutive depositions of the organic layers 401 and the top electrode layer 402. As described above, the organic layers 401 consist of the hole transport layer (preferably TPD from about 15 to 30 nm thick) and the electron transport and radiation emitter layer (both functions are conveniently combined in the preferred Alq3, undoped or doped, from about 55 to 80 nm). The top electrode layer 402 is preferably made of aluminum, sometimes alloyed with magnesium or calcium, from about 100 to 1000 nm thick. Other options include any material that can withstand the photolithography process and has the proper electrical properties.

It is preferred by the present invention that the depositions of the organic layers 401 and the top metal electrode layer 402 are performed sequentially in one vacuum pump-down without breaking the vacuum. Successful vacuum systems are cryopumped to about 10–6 Torr, contain several crucibles or boats, a shutter and a thickness monitor, and are operated at room temperature. Using this process will form the metal/organic interface before the surface of the organic layer is exposed to the ambient by the next process step, and thus insure stable OLED characteristics.

However, it may be acceptable for some applications to permit limited exposure of the organic layers to ambient before the top electrode layer is deposited. In these cases, spin coating of the organic layers, or similar low cost techniques, may be used, followed by evaporation of the top electrode layer.

Figure 5:
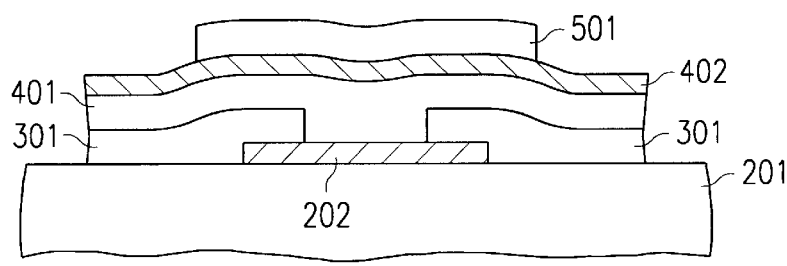

FIG. 5 illustrates process STEP #4: Spin coating and patterning of photoresist layer 501. The patterned photoresist layer 501 defines the area of the OLED-in-fabrication. If baking of the photoresist is required, it should be done at temperatures well below the temperature limits of the organic layers.

Process STEP #4 requires photomask #3.

Figure 6:
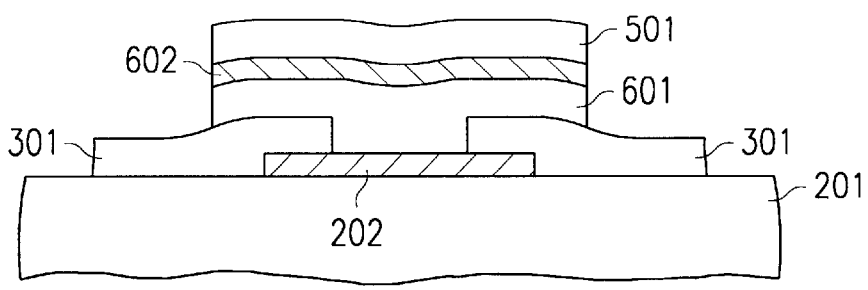

FIG. 6 illustrates process STEP #5: Removal of the top electrode layer 402 and the organic layers 401 in the unmasked areas. This process step is thus forming cathode (top electrode) 602 and organic OLED layers 601. In this process step, the photoresist layer is used as a mask to protect the organic layers and the top electrode layer during the patterning process.

Figure 7:
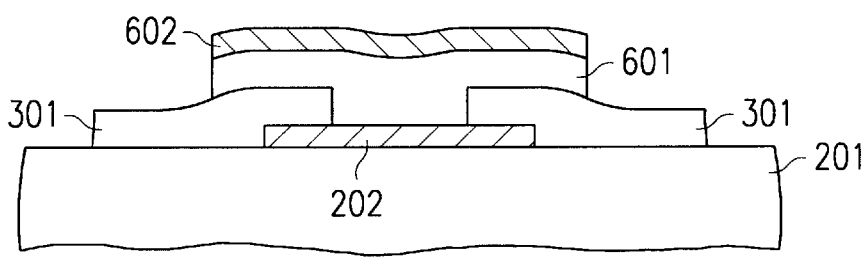

FIG. 7 illustrates process STEP #6: Removal of photoresist 501 on the remaining cathode (top electrode) area 602. The remaining photoresist layer (501 in FIG. 6) may be removed by ashing in oxygen plasma or other similar methods. Degradation of the OLED characteristics can be avoided if heating during the plasma processing is minimized. This can be achieved by using an ashing process of three 5-minute cycles with interval periods, instead of one continuous 15-minute cycle. In principle, the OLED structure is now formed; it is advisable, however, to add the following fabrication steps in order to achieve high diode reliability.

Figure 8:
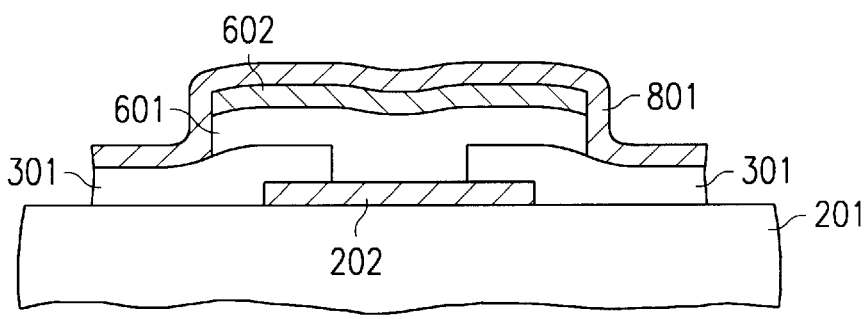

FIG. 8 illustrates process STEP #7: Deposition of the encapsulating layer 801. This process step is preferably achieved by evaporation of aluminum in the thickness range from about 100 to 1000 nm.

Process STEP #8: Spin coating and patterning a photoresist layer for defining the encapsulation and outer contact areas.

Process STEP #8 requires photomask #4.

Process STEP #9: Removal of the encapsulation layer in the unmasked areas.

Process STEP #10: Removal of photoresist on the remaining encapsulation layer.

Figure 9:
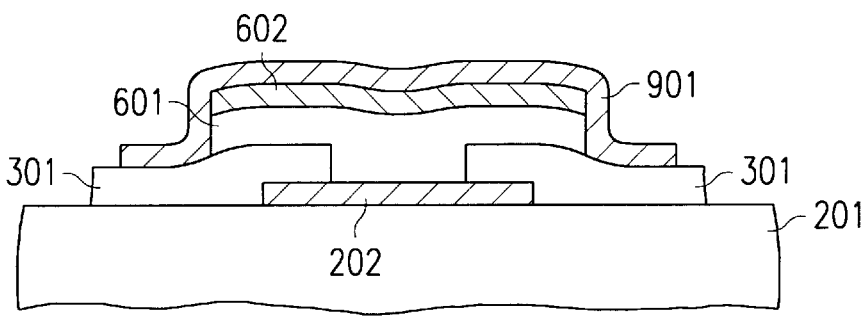

FIG. 9 depicts the OLED result after completing the sequential process STEPS #8, #9, and #10. The patterned encapsulation is designated 901; it also represents the outer contact for cathode 602. Encapsulation 901 eliminates any exposure of the organic layers 601 to ambient, oxygen and moisture; it also protects the junction between the organic layers 601 and cathode 602. As a consequence, encapsulation 901 results in increased OLED performance and lifetime. Preferred material for the encapsulation layer 801 is aluminum, although a variety of materials may be used. It is desirable that the encapsulation is electrically conductive since the contact area can be fabricated at this step. Unless the deposition of the encapsulation layer is conformal, layer 801 needs to be thicker than the organic layers 601. In order to form encapsulation and contact area 901, the patterning of the encapsulating layer 801 may be performed by ion milling as long as the sample stage is cooled to minimize temperature rise during ion milling. Short milling cycle times should be used, such as repeated cycles of 1-minute milling followed by 2-minute cooling periods, instead of continuous milling for several minutes. Also, solvents may be used for patterning, since the organic layers 601 are now encapsulated by layer 801 and thus not exposed to the solvents.

Process STEP #11: Deposition of a protective overcoat layer, preferably silicon nitride about 1 $\mu$m thick. This overcoat protects the OLED against scratches; further, silicon nitride is hermetic against moisture.

Figures 10A, 10B:
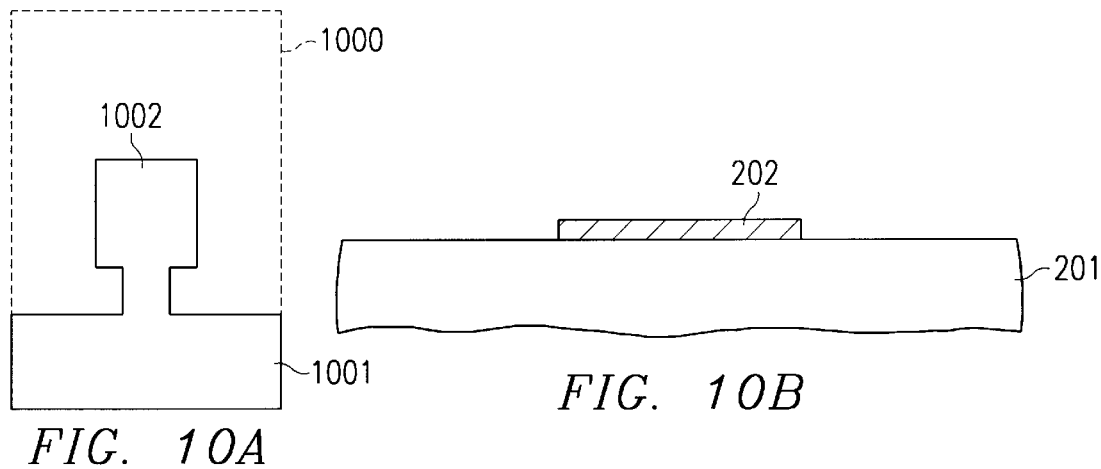
FIGS. 10 to 13 are top views and corresponding simplified cross sections of an OLED fabricated by the sequential processing steps depicted in FIGS. 2 to 9. The structures shown are.

By way of example, FIGS. 10 to 13 repeat those four process steps which require the. application of photomasks and illustrate these fabrication steps by top views of the OLED-in-progress, in addition to the cross sectional views. FIG. 10 corresponds to the fabrication status after process STEP #1 in FIG. 2. Bottom electrode 202 is deposited onto substrate 201, and patterned. This patterning includes contact area 1001 for electrically accessing the bottom electrode 1002. Dashed outline 1000 indicates the total area to be reserved for constructing the OLED.

Figures 11A, 11B:
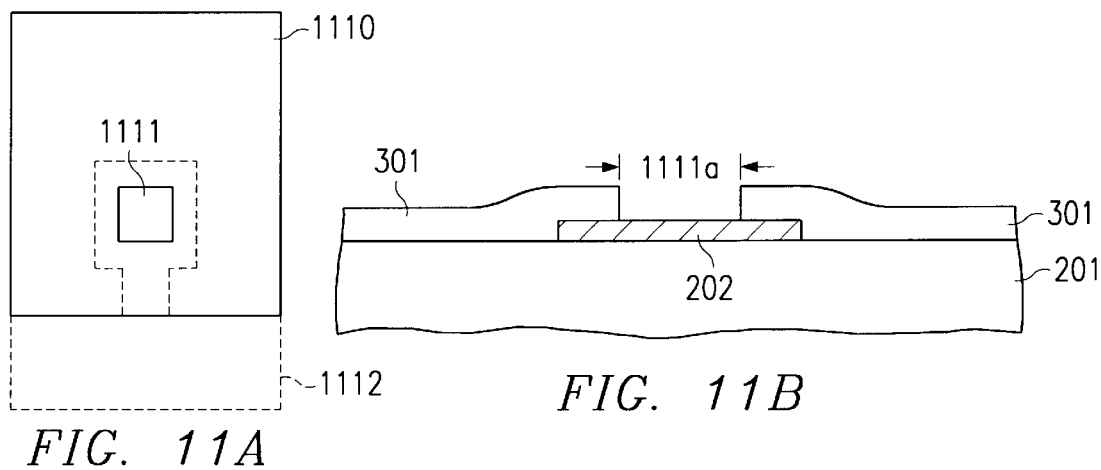

FIG. 11 corresponds to the fabrication status after process STEP #2 in FIG. 3. Insulating layer 301 is deposited and patterned to form area 1110. Insulating area 1110 has opening area 1111 (shown as square, but may have different shapes) with a side length 1111a. Dashed lines 1112 outline the area of the bottom electrode indicated in FIG. 10.

Figure 12A:
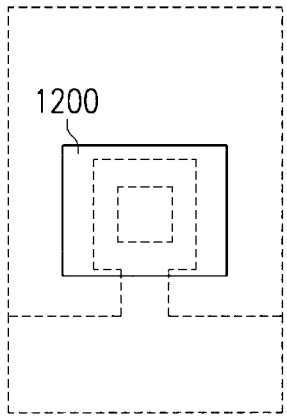
Figure 12B:
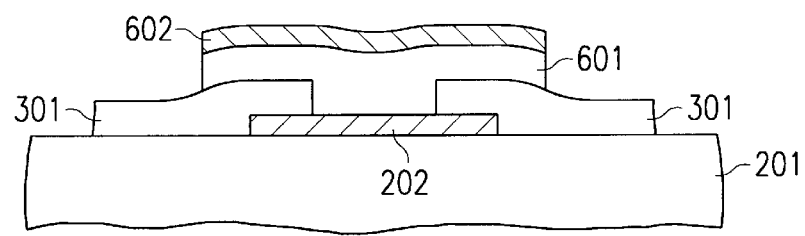

FIG. 12 corresponds to the fabrication status after process STEP #6 in FIG. 7. With the patterning of top electrode 1200, the OLED structure has been defined.

Figure 13A:
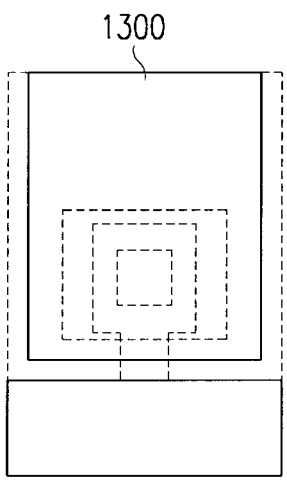
Figure 13B:
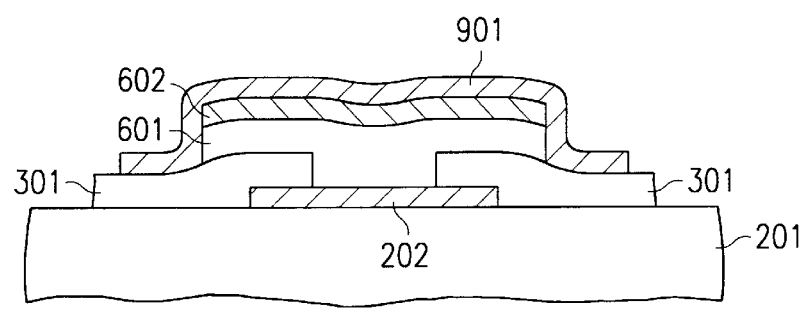

FIG. 13 corresponds to the fabrication status after process STEP #10 in FIG. 9. The encapsulation, preferably aluminum, has been deposited and patterned, and thus the enlarged contact area 1300 for the top electrode defined.

Figure 14:
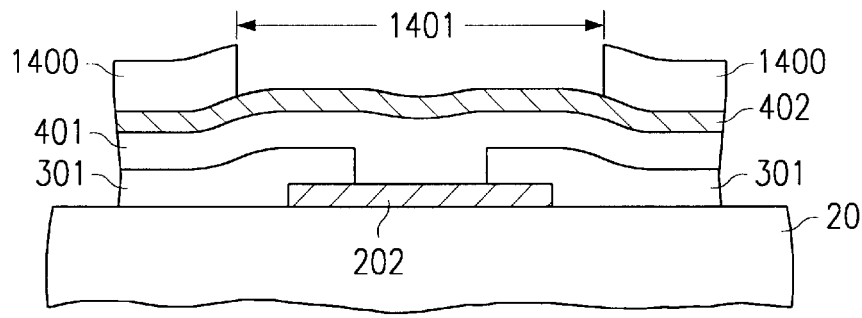
FIGS. 14 to 17 are schematic cross sectional views of the structures created sequentially by alternative OLED fabrication steps according to the invention. The structures shown are created after the following process steps.
Figure 15:
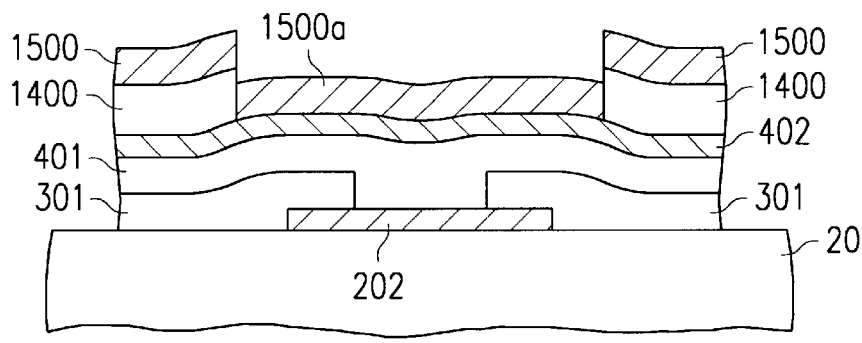
Figure 16:
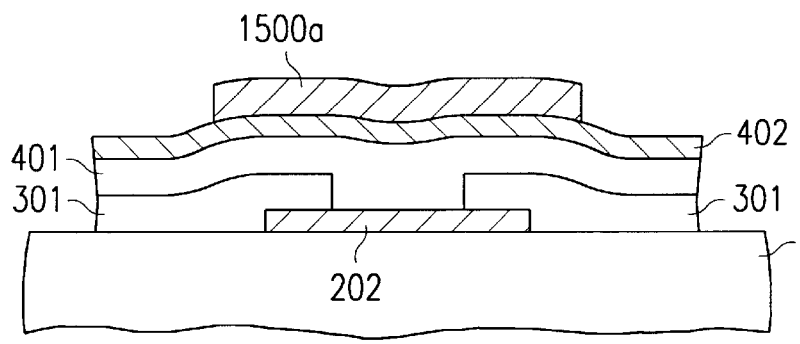

A number of process steps described above can be modified in various ways within the scope of this invention. For instance, the photomask design used in process STEP #4 can be inversed in order to arrive at the structure of FIG. 5. The resulting "lift-off" process is illustrated in FIGS. 14 to 16. FIG. 14 is similar to FIG. 4 except for the photoresist layer 1400 which has been added and patterned. The opening 1401 in the photoresist layer is defining the width of the top electrode; it exposes the surface of metal layer 402 (preferably aluminum, free of pinholes).

In FIG. 15, additional contact metal 1500 is deposited as a layer having a thickness smaller than the thickness of photoresist layer 1400. As a consequence, the portion 1500a of the additional metal is discontinuous with the remaining metal layer. This remaining metal can thus be lifted off using solvents for removing the photoresist layer 1400 (see FIG. 16). Obviously, metal layer 402 should preferably be pinhole free in order to avoid leakage of the solvents though the pinholes and potential attack of the organic layers 401.

A variety of methods may be used to remove the top electrode layer 401 and the organic layers 402 in the unmasked portions of FIG. 16. When ion milling using an argon beam is employed for the patterning, both the unmasked areas of layers 401 and 402 can be removed since the etch rates for the materials in both layers are similar. When reactive ion etching is employed for the patterning, different etch chemistry might be needed for the top electrode and the organic layers. When wet chemical etching is employed for the patterning, the etch rate of the top electrode layer should be similar or larger than the etch rate of the organic layers. Since the thickness of the organic layers is typically only approximately 100 nm and thus much smaller than the OLED device size, undercutting by wet etching is not a serious problem unless the etch rate of the organic layers is much higher than the etch rate of the top electrode layer.

Figure 17:
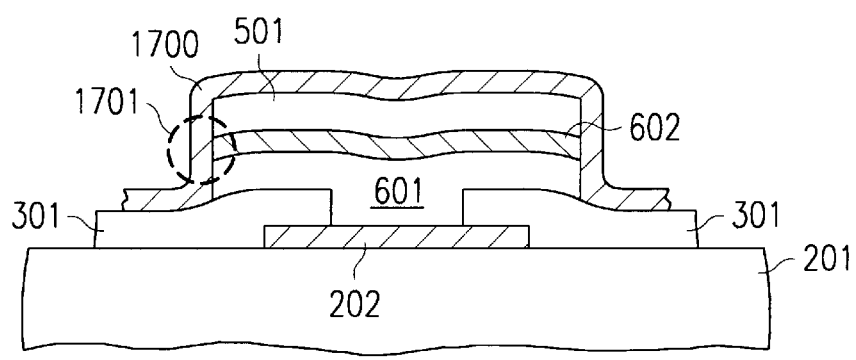

Another process variation of the present invention concerns the remaining photoresist layer 501 in FIG. 6. The removal of this layer (process step #6) may not required, leading to the structure depicted in FIG. 17. In this case, the encapsulating metal layer 1700 is preferably deposited by multiple angle evaporation. Preferred metal is again aluminum, from about 100 to 1000 nm thick. As can be seen in the cross sectional view of FIG. 17, the encapsulating layer 1700 makes contact to the top electrode 602 from the sides, such as at designation 1701.

Figure 18:
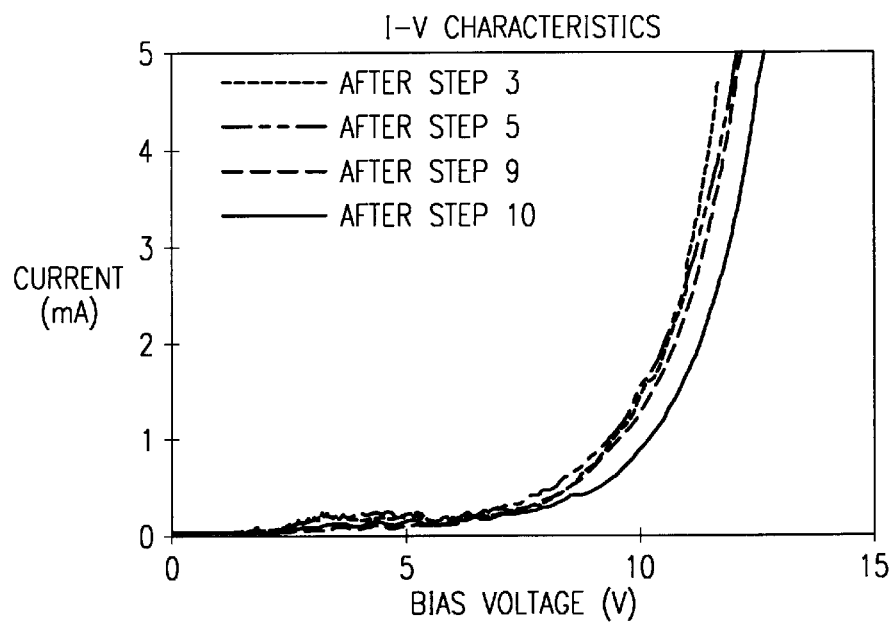
FIG. 18 displays OLED current-voltage characteristics measured at different processing steps.
Figure 19:
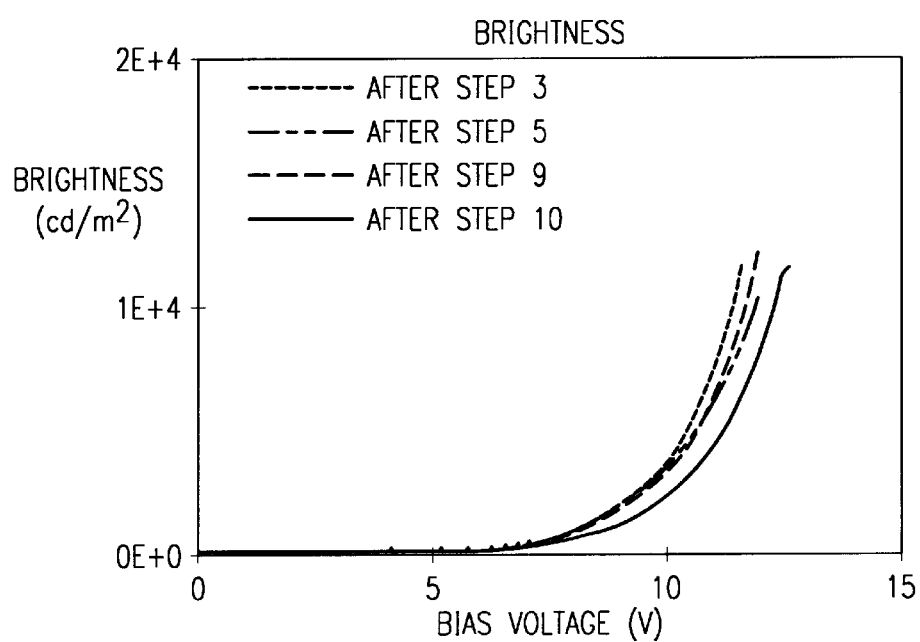
FIG. 19 displays OLED brightness-voltage characteristics measured at different processing steps.

FIGS. 18 to 21 display several OLED characteristics at various process steps in order to compare these characteristics and monitor any changes caused by process procedures. In FIG. 18, the diode current (in mA) is plotted as a function of bias voltage (in V), measured after process STEPS #3, #5, #9, and #10. In these examples, ion milling was the process of choice both for process STEPS #5 and #9. As the diagram shows, only minor changes are observed. Again, only minor changes are measured in FIG. 19, where the diode brightness (expressed in candela m$^2$) is plotted as a function of bias voltage (in V) after process STEPS #3, #5, #9 and #10.

Figure 20:
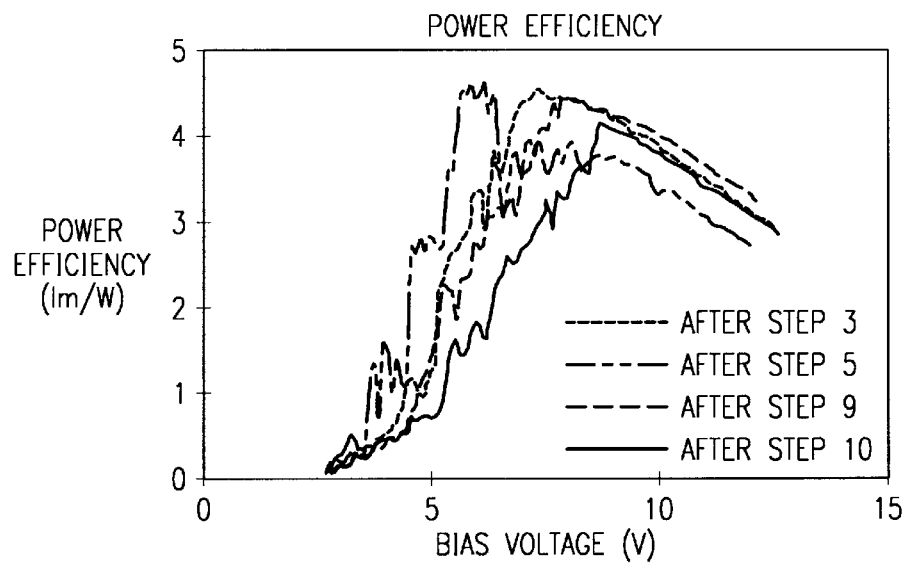
FIG. 20 displays OLED power efficiency-voltage characteristics measured at different processing steps.

In FIG. 20, the diode power efficiency (in lumen/W) is plotted as a function of bias voltage (in V) . While some statistically erratic data were recorded, which are not fully understood at this time, they have little relation to the process procedures of this invention. In general in can be stated that only minor degradation of the power efficiency is observed from process STEP #3 to STEP #10.

Figure 21:
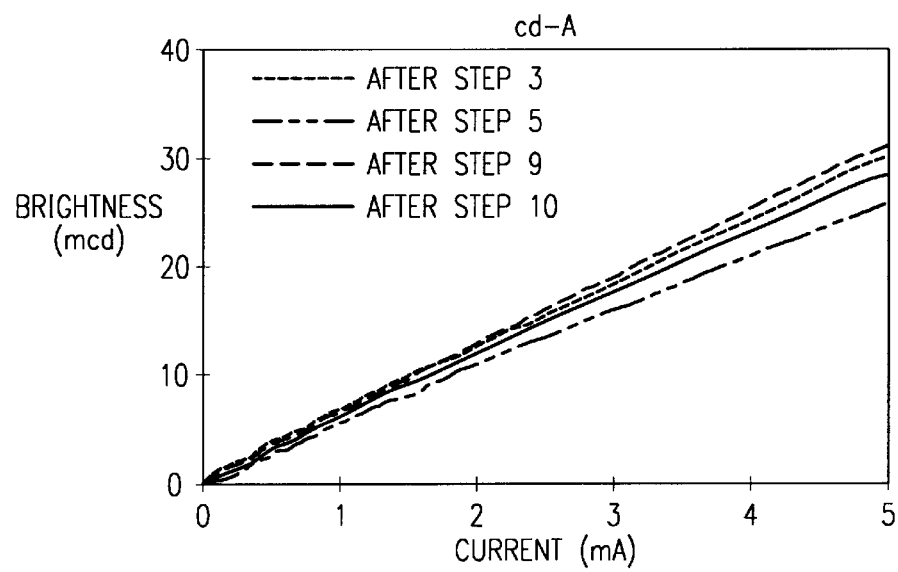
FIG. 21 displays OLED brightness-current characteristics at different processing steps.

In FIG. 21, diode brightness (expressed in mcd) is plotted versus diode current (in mA). Again, only minor changes are recorded due to process steps.

In summary, it can be stated that the fabrication methods for OLEDs, employed by this invention, produce diodes with reproducible and reliable characteristics. This has, in fact, also be observed for the process variations described above, as long as any temperature rise of the product remained tightly controlled during processing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor substrate in the electronic components may comprise silicon, silicon germanium, gallium arsenide, or any other semiconductor material used in manufacturing. As another example, the OLEDs described may be modified for producing organic laser diodes by adding reflective surfaces surrounding a portion of the OLED, configured to provide a high-gain laser cavity. As another example, the fabrication processes described may be applied to OLEDs having an anode including a tunneling barrier at the interface with the hole transport layer for enhancing charge injection, and having a cathode including a tunneling barrier at the interface with the electron transport layer for enhancing charge injection. It is therefore intended that the appended claims encompass any such modifications or embodiments.

We claim:

1. A method for fabricating a plurality of organic light emitting diodes, each having at least one organic layer, an anode and a cathode, comprising the steps of:

depositing and photolithographically patterning said anode;

depositing and photolithographically patterning an insulating layer between said anode and said cathode;

depositing said at least one organic layer;

depositing a layer for said cathode;

depositing and photolithographically patterning a first photoresist layer for masking the areas of said light emitting diodes;

removing the unmasked portions of said cathode layer and said organic layer;

depositing an encapsulating electrically conductive layer;

depositing and photolithographically patterning a second photoresist layer for masking the areas intended for electrical contact and encapsulation;

removing the unmasked portions of said encapsulating layer; and removing the remaining portions of said second photoresist layer.

2. The method according to claim 1 further comprising the step of removing the remaining portions of said first photoresist layer before depositing said encapsulating layer.

3. The method according to claim 1 further comprising the step of depositing a protective overcoat over said plurality of organic light emitting diodes.

4. The method according to claim 1 wherein said organic layer is suitable for hole transport, electron transport, and radiation emission and has a thickness in the range from about 80 to 120 nm.

5. The method according to claim 1 wherein said organic layer is a stack comprising a layer suitable for hole transport and a layer suitable for electron transport and for electron-hole recombination and luminescence, in the total thickness range from about 80 to 120 nm.

6. The method according to claim 1 wherein said steps of depositing said organic layer and said protective metal layer are performed consecutively in unbroken vacuum, thereby protecting the metal/organic interface from moisture or ambient.

7. The method according to claim 1 wherein said insulating layer is silicon nitride or silicon dioxide in the thickness range from about 30 to 100 nm.

8. The method according to claim 1 wherein said encapsulating electrically conductive layer is aluminum in the thickness range from about 100 to 1000 nm.

9. The method according to claim 1 further comprising the step of depositing a protective overcoat over the completed organic light-emitting diodes.

10. The method according to claim 9 wherein said protective overcoat is silicon nitride approximately 1 $\mu$m thick.

11. The method according to claim 1 first electrically conducting layer is transparent and made of indium tin oxide or zinc oxide in the thickness range from about 100 to 150 nm, or gold in the thickness range from about 4 to 6 nm.

* * * * *